United States Patent [19]
Chu et al.

[11] Patent Number: 6,127,229
[45] Date of Patent: Oct. 3, 2000

[54] PROCESS OF FORMING AN EEPROM DEVICE HAVING A SPLIT GATE

[75] Inventors: Wen-Ting Chu, Kaoushiung County; Di-Son Kuo, Hsinchu; Hung-Cheng Sung; Jack Yeh, both of Hsin-chu; Chia-Ta Hsieh, Tainan; Yai-Fen Lin, Tron-Tour, all of Taiwan

[73] Assignee: Taiwan Semiconductor Manufacturing Company, Hsin-Chu, Taiwan

[21] Appl. No.: 09/301,222

[22] Filed: Apr. 29, 1999

[51] Int. Cl.[7] ................................................. H01L 21/8247
[52] U.S. Cl. ............................................ 438/264; 438/266
[58] Field of Search ..................................... 438/257–267

[56] References Cited

U.S. PATENT DOCUMENTS

| | | | |
|---|---|---|---|
| 5,422,289 | 6/1995 | Pierce | 437/32 |
| 5,427,968 | 6/1995 | Hong | 437/43 |
| 5,480,821 | 1/1996 | Chang | 437/43 |
| 5,541,130 | 7/1996 | Ogura et al. | 438/266 |
| 5,950,087 | 9/1999 | Hsieh et al. | 438/264 |
| 6,008,089 | 12/1999 | Hong | 438/259 |
| 6,017,795 | 1/2000 | Hsieh et al. | 438/262 |
| 6,043,120 | 3/2000 | Early et al. | 438/257 |

*Primary Examiner*—Richard Booth
*Attorney, Agent, or Firm*—George O. Saile; Stephen B. Ackerman; Wolmar J. Stoffel

[57] ABSTRACT

There is presented an improved method of fabricating an EEPROM device with a split gate. In the method, a silicon substrate is provided having spaced and parallel recessed oxide regions that isolate component regions where the oxide regions project above the top surface of the substrate. A thin gate oxide is formed on the substrate, and a first conformal layer is deposited over the gate oxide and projecting oxide regions. The substrate is then chemical-mechanically polished to remove the projections of polysilicon over the oxide regions. A silicon nitride layer is deposited on the resultant planar surface of the polysilicon, and elongated openings formed that will define the position of the floating gates that are perpendicular to the oxide regions. The exposed polysilicon in the openings in the silicon nitride are oxidized down to at least the level of the underlying silicon oxide regions, and the silicon nitride layer removed. The polysilicon layer is then removed using the silicon oxide layer as an etch barrier, and the edge surfaces of the resulting polysilicon floating gates oxidized. A second polysilicon layer is deposited on the substrate and elongated word lines formed that are parallel and partially overlapping the floating gates. Source lines are formed in the substrate, and gate lines are formed that overlie the floating gates.

10 Claims, 6 Drawing Sheets

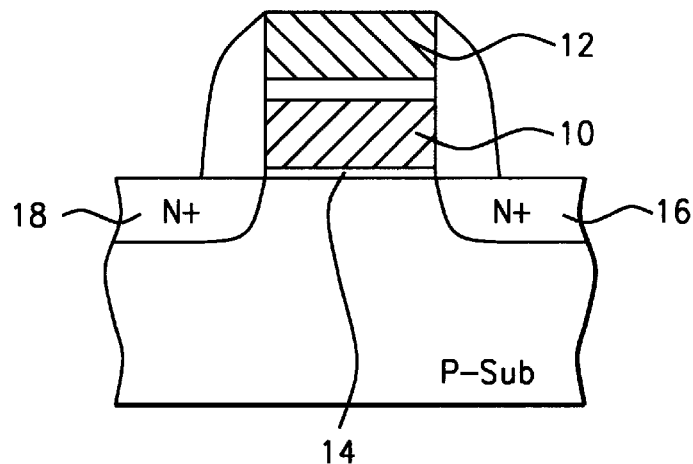
FIG. 1 - Prior Art
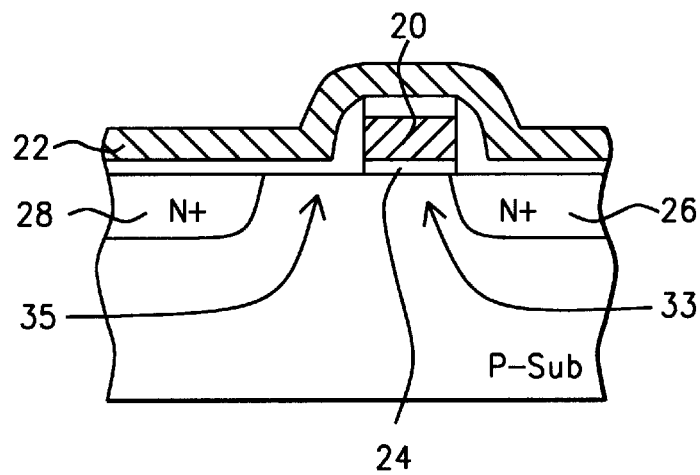
FIG. 2 - Prior Art
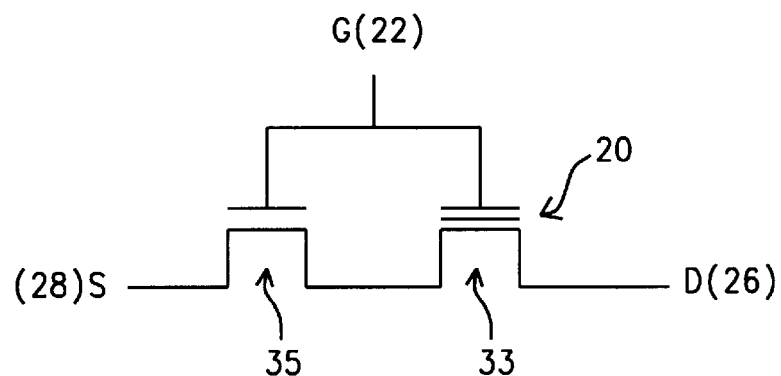
FIG. 3 - Prior Art

PROCESS OF FORMING AN EEPROM DEVICE HAVING A SPLIT GATE

BACKGROUND OF THE INVENTION

1. Field of the Invention

This invention relates to a method for producing an electrically erasable and programmable read-only memory (EEPROM) device having a split-gate.

2. Technical Background

EEPROM devices are well known and widely used in a variety of electronic equipment where memory is needed that will survive an interruption of electric current. Conventional EEPROM devices have memory cells which comprise floating-gate transistors. Such devices are able to maintain information written into the memory cells in the absence of a power source for the device, and are fixer capable of having information stored in their memory cells erased. These memory devices, however, suffer from their relatively slow read/write access times, which are typically in the range of 150 to 200 nsec. EEPROM devices capable of operating at faster speeds have been developed in the last several years.

One of the problems that EEPROM devices suffer from is the problem of "over-erasure" of the memory cell contents during erasure operations. As can be seen in FIG. 1, the floating-gate transistor has a floating gate 10 and a control gate 12, capable of injecting electrons from the drain 16, based on a phenomena known as the Fowler-Nordheim Tunneling Effect, through a tunneling oxide layer 14 into the floating gate 10. The threshold voltage of a floating-gate transistor can be raised by means of such electron injection, and the device then assumes a first state that reflects the content of the memory cell. On the other hand, during erasure of the memory cell, electrons are expelled from the source 18 through the tunneling oxide layer 14 and out of the floating gate 10 of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e. more electrons than were previously injected. This results in the formation of electron holes in the floating gate of the device. In severe cases, the floating-gate transistor becomes a depletion transistor, which conducts even in the absence of the application of a control voltage at the control gate 12. This phenomena is known in the art as memory over-erasure.

To overcome the above described memory over-erasure problem of conventional EEPROM devices, a split-gate EEPROM was proposed. In FIG. 2 schematically shows such a split-gate device. The memory device has a floating-gate transistor, which similarly includes a floating gate 20 and a control gate 22, as in the case of the floating-gate transistor of FIG. 1. However, the floating gate 20 only covers a portion of channel region and the rest of the channel region is directly controlled by the control gate 22. This split-gate based memory cell is equivalent to a series connected floating-gate transistor 33 and a enhanced isolation 35, as is schematically represented in FIG. 3. The principal advantage of such this configuration is obvious. The isolation transistor 35 is free from the influence of the state of the floating gate 20 and remains in its off state, even if the floating-gate transistor 33 is subjected to the phenomena of over-erasure and therefore is in a conductive state. The memory cell can thus maintain its correct state, which reflects the correct state of the memory contents, in spite of the over-erasure problem.

The fabrication of EEPROM devices, particularly when they are highly microminiturized, remains difficult. The dimensions of the various elements are very small which may cause misalignment difficulties.

SUMMARY OF THE INVENTION

It is therefore an object of the present invention to provide an improved method for fabricating EEPROM devices having a split gate.

Another object of the invention is to provide a method of fabricating EEPROM devices which eliminates, or minimizes, floating gate misalignments, and reduces the word-line coupling ratio.

In accordance with the foregoing objectives, there is presented an improved method of fabricating an EEPROM device with a split gate. In the method, a silicon substrate is provided having spaced and parallel recessed oxide regions that isolate component regions where the oxide regions project above the top surface of the substrate. A thin gate oxide is formed on the substrate, and a first conformal layer is deposited over the gate oxide and projecting oxide regions. The substrate is then chemical-mechanically polished to remove the projections of polysilicon over the oxide regions. A silicon nitride layer is deposited on the resultant planar surface of the polysilicon, and elongated openings formed that will define the position of the floating gates that are perpendicular to the oxide regions. The exposed polysilicon in the openings in the silicon nitride are oxidized down to at least the level of the underlying silicon oxide regions, and the silicon nitride layer removed. The polysilicon layer is then removed using the silicon oxide layer as an etch barier, and the edge surfaces of the resulting polysilicon floating gates oxidized. A second polysilicon layer is deposited on the substrate and elongated word lines formed that are parallel and partially overlapping the floating gates. Source lines are formed in the substrate, and gate lines are formed that overlie the floating gates.

BRIEF DESCRIPTION OF THE DRAWINGS

Other objects, features and advantages of the present invention will become apparent by way of the following detailed description of the preferred but non-limiting embodiment, with reference to the accompanied drawings, wherein:

FIG. 1 is a cross sectional view of a floating gate transistor for an EEPROM memory cell that is known in the prior art.

FIG. 2 is a cross section view of a split-gate EEPROM memory cell that is known in the prior art.

FIG. 3 is a schematic diagram showing the electrical equivalent of the memory cell of FIG. 2.

DETAILED DESCRIPTION OF THE PREFERRED EMBODIMENTS

Figure 4A:
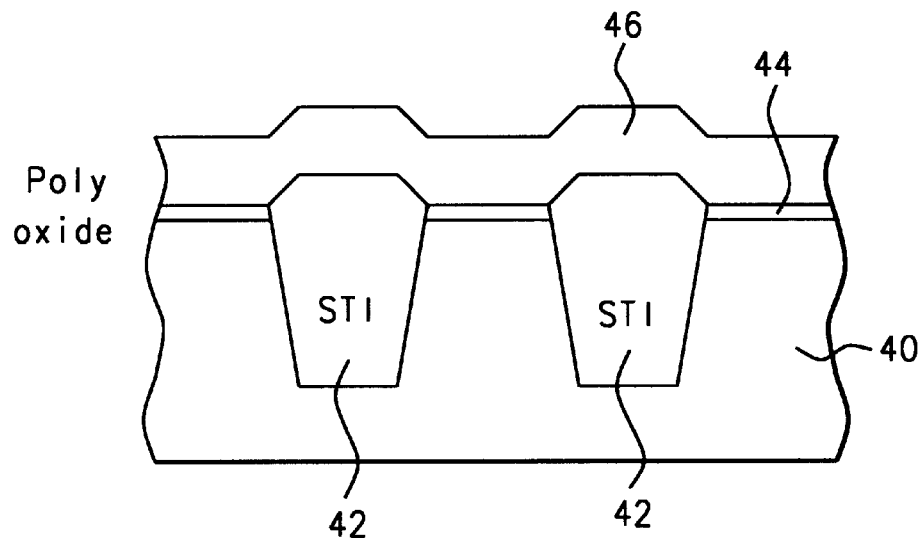
FIGS. 4A and B, through 7A and B, is a sequence of cross sectional views, and top plan views, of an EEPROM cell which depict the various process steps of the method of the invention.
Figure 4B:
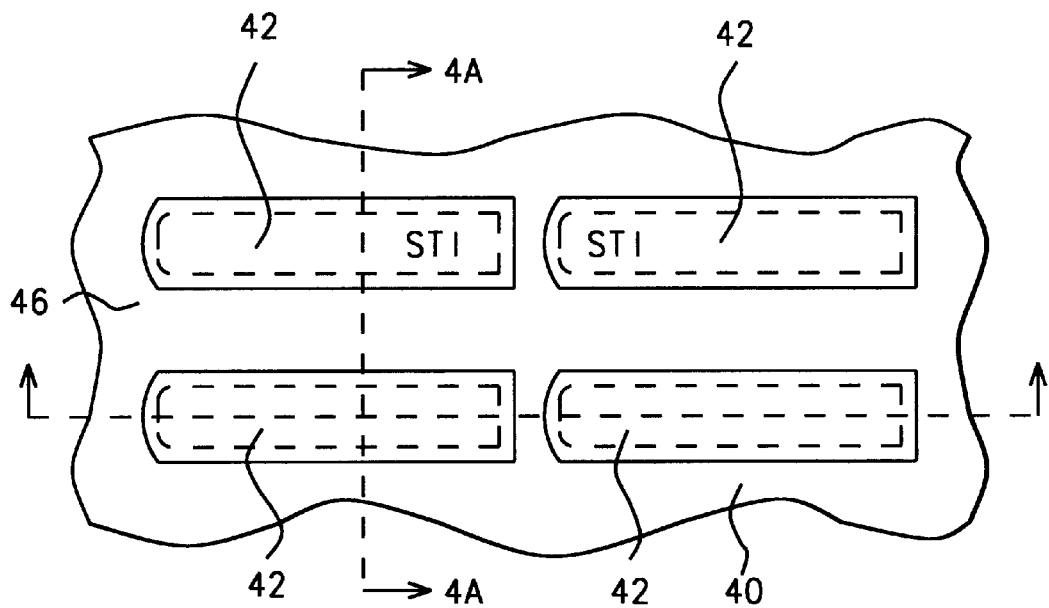

Referring now to the Fig's of the drawings, particularly to FIGS. 4A–4B, through 7A–B, there is illustrated the steps of the process of the invention. As indicated in FIG. 4A and FIG. 4B, recessed oxide regions 42 are formed in monocrystalline substrate 40. Regions 42 are formed in the conventional manner by forming an oxidation resistant masking layer, for example $Si_3N_4$, on the substrate 40, forming openings that define positions of the recessed oxide regions, and then subjecting the substrate to an oxidizing environment. Since the resultant silicon oxide occupies a greater volume than the genetic silicon, the resultant regions 42 project above the surface plane of substrate 40. The oxidation resistant mask layer is then removed and a gate oxide 44 is formed on the surface of substrate 40. The gate oxide is typically silicon oxide with a thickness in the range of 60 to 120 angstroms. A conformal layer of polysilicon 46 is deposited using known deposition tectoniques on substrate 40 to a thickness greater than the height of the projecting regions 42 above the surface of gate oxide 44. The thickness of layer 46 is typically in the range of 500 to 3000 angstroms. The polysilicon can be deposited either as doped or undoped. If the polysilicon is undoped, it can be later doped by ion implantation.

Figure 5A:
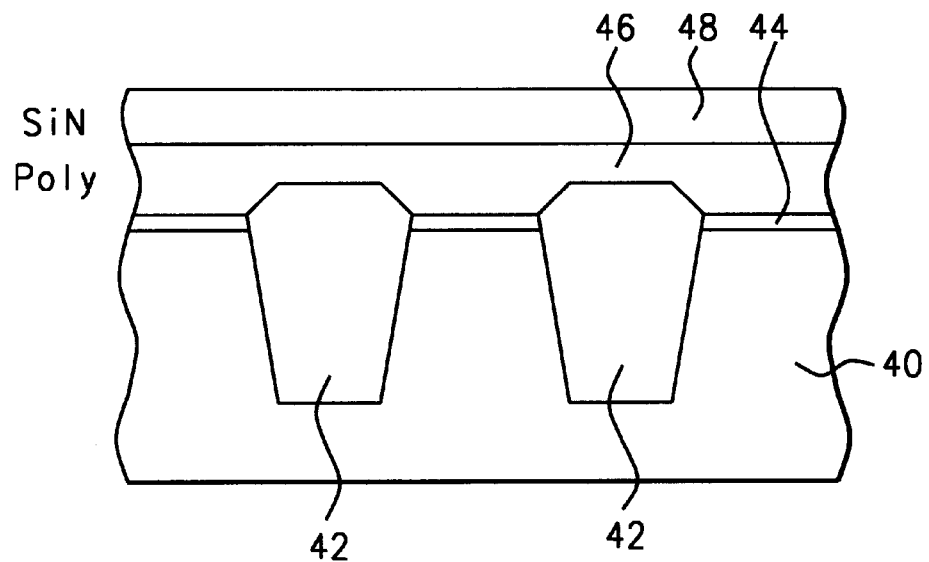
Figure 5B:
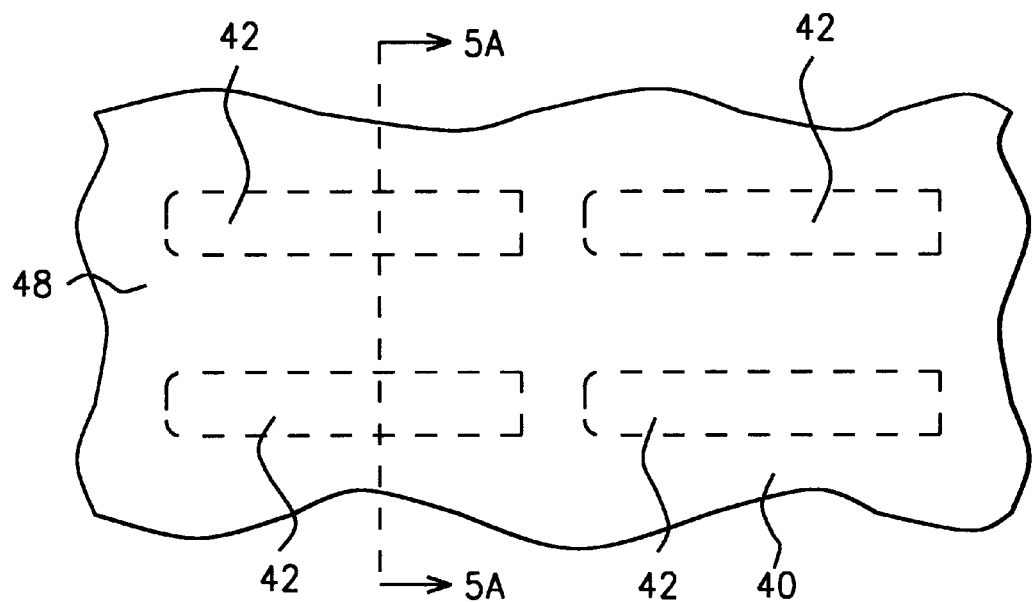
Figure 6A:
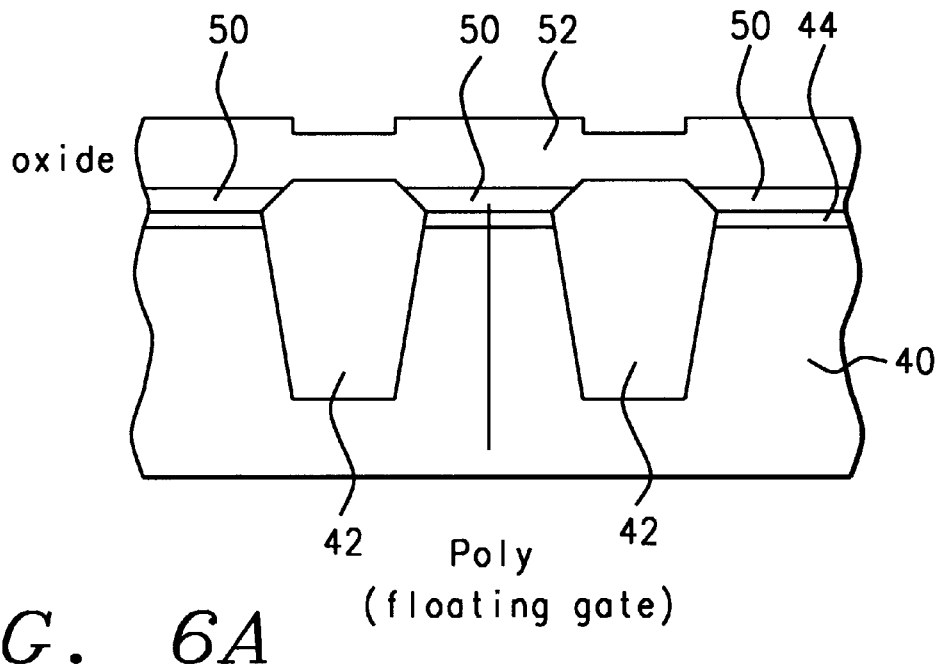
Figure 6B:
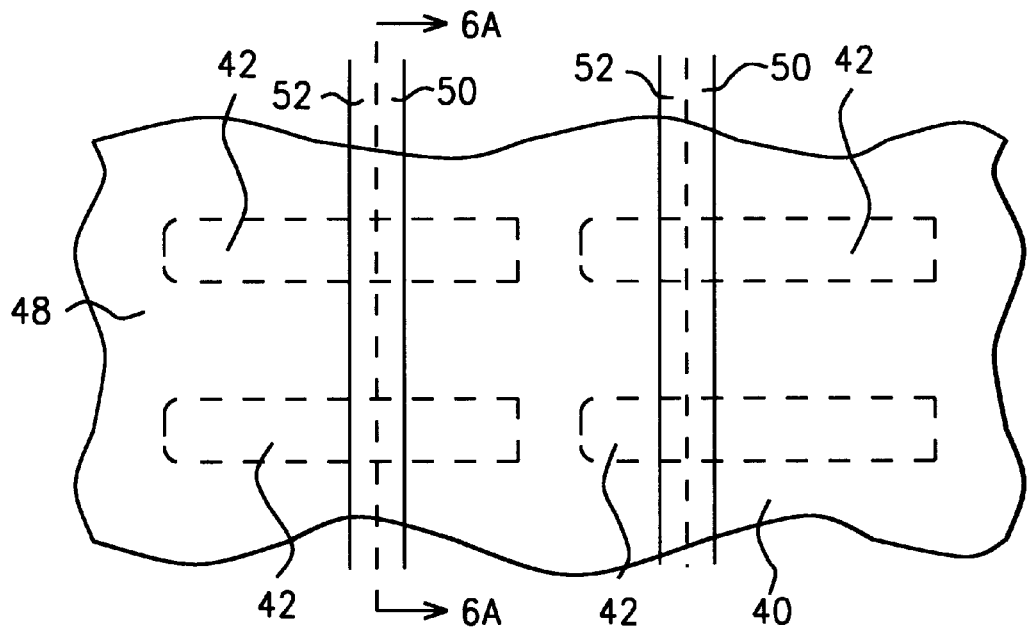

Referring to FIGS. 5A and 5B, the surface of substrate 40 is subjected of a chemical-mechanical polishing operation in which the projections of polysilicon over regions 42 are removed leaving a planar top surface. An oxidation resistant masking layer 48 is then deposited over polysilicon layer 46, having a thickness preferably in the range of 500 to 3000 angstroms. Elongated openings that perpendicular to oxide regions 42, are formed which will define the locations of the floating gates, to be fabricated, as shown in FIG. 6B. The exposed polysilicon of layer 46, through these openings are oxidized at least down through the polysilicon layer 46 to the top surface of regions 42. The oxidization should proceed to slightly below the top surface of regions 42. The resultant silicon oxide 52 overlies the remaining polysilicon layer portions of 46, forming floating gates 50. The profile of the oxidized region is depicted most clearly in FIG. 6A. Note that portions of polysilicon layer 46 oxide regions remains, which will become the floating gates 50. Note also that the thickness of oxide 52, that overlies regions 42, is thinner than the portions that overlie the gates 50. This variation is due to the fact that the polysilicon oxidation proceeded longer over gates 50. The oxidation resistant layer 48, over polysilicon layer 46 is removed, and the resultant exposed polysilicon layer is etched away using the silicon oxide 52 as a mask to prevent removal of floating gates 50. The edges of gates 50 are oxidized to form an insulating layer to complete its electrical isolation. The thickness of the sidewall oxide 51 on gates 50 is preferably in the range of 80 to 300 angstroms. The vertical thickness of floating gate 50 is in the range of 100 to 1000 angstroms. As indicated, the longitudinal dimensions of gates 50 are previously defined by oxide regions 42.

Figure 7A:
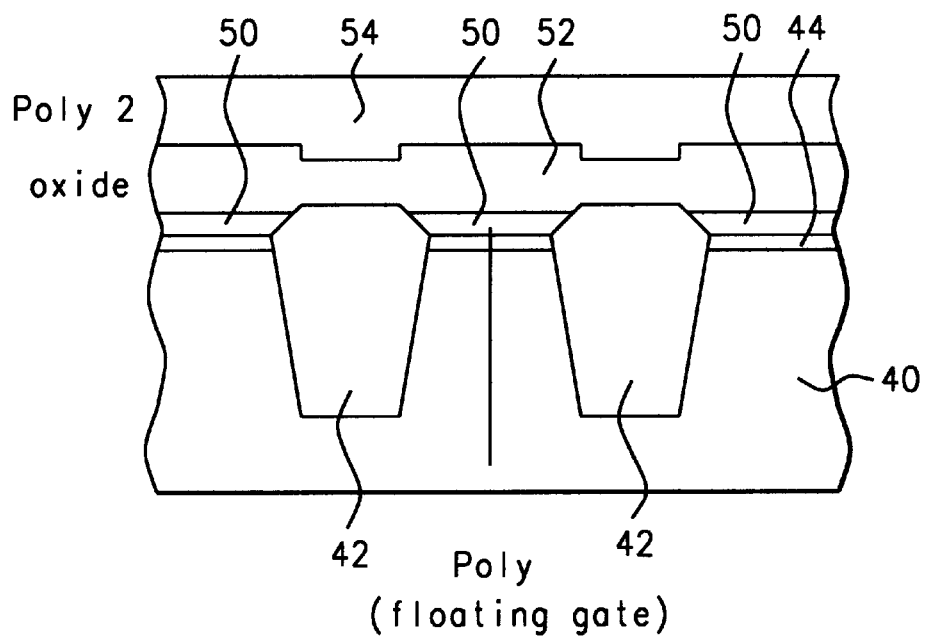
Figure 7B:
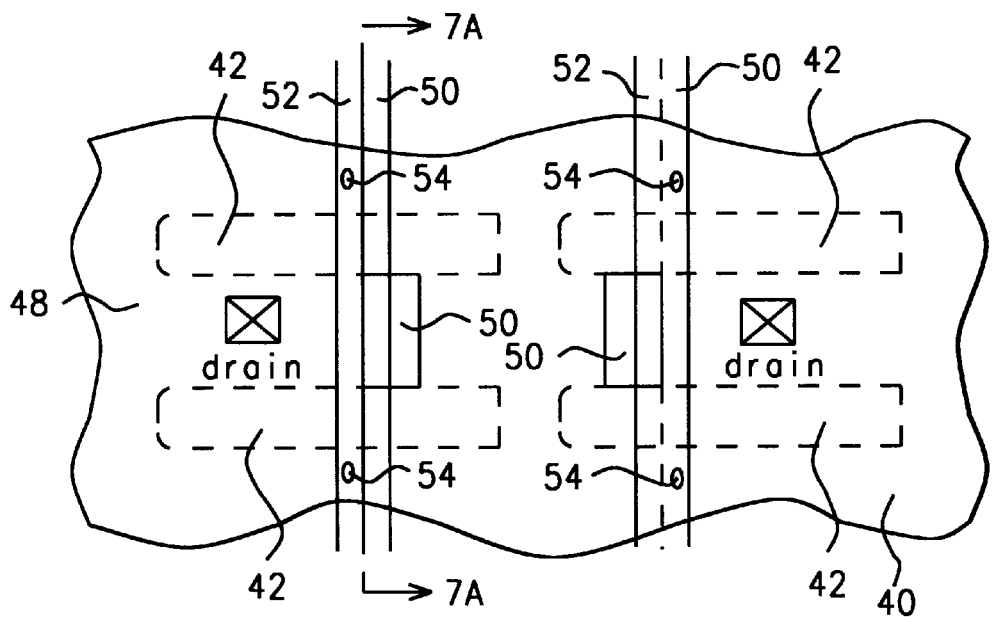
Figure 8:
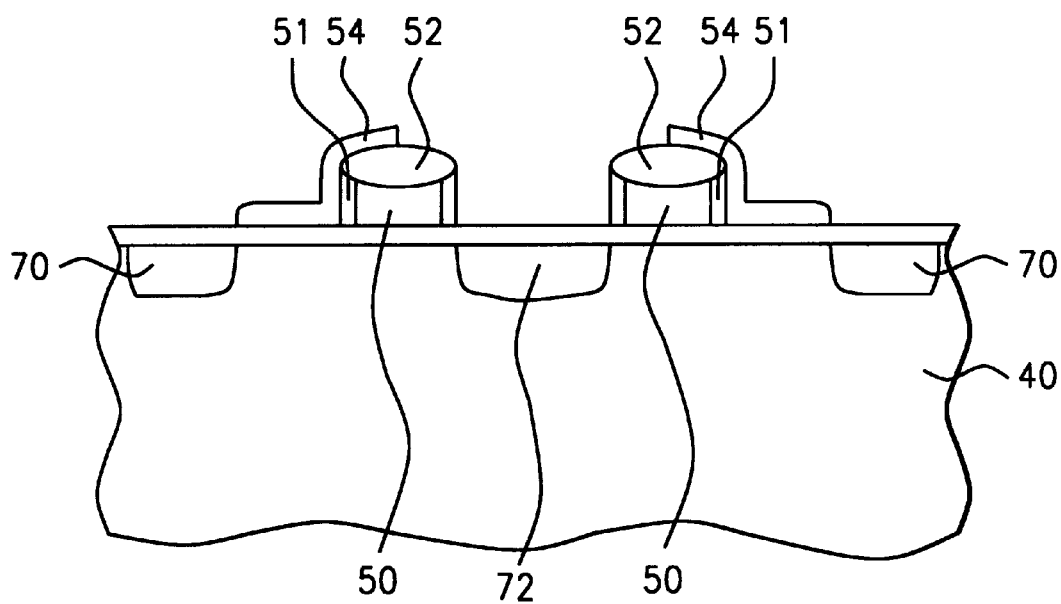
FIG. 8 is a cross sectional view of the completed EEPROM cell produced by the method of the invention.

As shown in FIG. 7A and FIG. 7B, a second polysilicon layer is deposited on substrate 40. A masking layer is deposited over the polysilicon layer and masked to define word lines, which extend perpendicular to regions 42 and partially overlie floating gate regions 50. Word lines 54 are illustrated in FIGS. 7A and 7B.

The drain regions 70 and the source line regions 72 are formed in substrate 40 using standard ion implantation techniques. Although not illustrated, a thin insulating layer is formed over polysilicon word lines 62 and conductive bit lines formed on the surface of substrate 40 that connect to drain regions 70.The bit lines are all parallel to each other and are positioned transverse to the source or word lines 72. This metallurgy is conventional and has not been illustrated to preserve the clarity of the other elements illustrated in the drawings. The completed device consists of an array of EEPROM's.

While the invention has been particularly shown and described with reference to the preferred embodiments thereof, it will be understood by those skilled in the art that various changes in form and details may be made without departing from the spirit and scope of the invention.

What is claimed is:

1. A process for fabricating an electrically erasable and programmable read only memory integrated circuit device having a split gate memory cell comprising:

providing a silicon substrate having spaced and parallel recessed oxide regions that isolate component regions, the oxide regions projecting above the top surface of said substrate, forming a thin gate oxide layer on the top surface of said silicon substrate, depositing a first conformal layer of polysilicon over said thin oxide layer and projecting oxide regions, chemical-mechanical polishing the top surface of the substrate to remove the projections of polysilicon over the field oxide regions, depositing a layer of silicon nitride over the resultant planar surface of said layer of polysilicon, forming elongated openings in the silicon nitride layer that are perpendicular to said field oxide regions that define the position of the floating gates, oxidizing the exposed polysilicon through said openings in the silicon nitride layer down to at least the top surfaces of said field oxide regions, thereby forming floating gate regions beneath a silicon oxide layer, removing the silicon nitride layer, removing the polysilicon layer using the silicon oxide layer over the floating gates as an etch barrier, oxiding the edge surfaces of the polysilicon floating gates, depositing a second polysilicon layer on the surface of the substrate, forming elongated word lines that are parallel and in close proximity to said floating gates from said second polysilicon layer, forming a source line in the substrate that is parallel to the word line and is spaced from said floating gates, and drain regions spaced from said source line, and forming a gate electrode on the surface of the substrate that overlies the floating gates and is perpendicular to said word lines.

2. The process of claim 1, wherein the first polysilicon layer is in the range of 500 to 3500 angstroms.

3. The process of claim 2, wherein the height of the projecting field oxide regions above the surface of the substrate is in the range of 600 to 2000 angstroms.

4. The process of claim 3, wherein said field oxide regions are formed by masking the substrate with an oxidation resistant layer, forming openings in the mask to define the locations of the field oxide regions, and oxidizing the exposed areas of the silicon substrate.

5. The process of claim 4, wherein the height of the projecting field oxide regions above the surface of the substrate is in the range of 600 to 2000 angstroms.

6. The process of claim 1, wherein the oxidation of the first polysilicon layer progresses to a level below the top surfaces of the field oxide region.

7. The process of claim 6, wherein the thickness of the first polysilicon layer, after oxidation through the openings in the silicon nitride layer, is in the range of 100 to 1000 angstroms.

8. The process of claim 7, wherein the thickness of the oxide layer over the floating gate is in the range of 600 to 2000 angstroms.

9. The process of claim 8, wherein the thickness of the oxide on the edge surfaces of the floating gate is in the range of 80 to 300 angstroms.

10. The process of claim 1 wherein spaced and parallel bit lines are formed that contact said drain regions in said substrate.

\* \* \* \* \*